United States Patent
Niu et al.

(10) Patent No.: US 9,269,699 B2
(45) Date of Patent: Feb. 23, 2016

(54) EMBEDDED PACKAGE AND METHOD THEREOF

(71) Applicant: Alpha and Omega Semiconductor Incorporated, Sunnyvale, CA (US)

(72) Inventors: Zhiqiang Niu, Santa Clara, CA (US); Hua Pan, Shanghai (CN); Ming-Chen Lu, Shanghai (CN); Yueh-Se Ho, Sunnyvale, CA (US); Jun Lu, San Jose, CA (US)

(73) Assignee: ALPHA AND OMEGA SEMICONDUCTOR INCORPORATED, Sunnyvale, CA (US)

( * ) Notice: Subject to any disclaimer, the term of this patent is extended or adjusted under 35 U.S.C. 154(b) by 0 days.

(21) Appl. No.: 14/273,762

(22) Filed: May 9, 2014

(65) Prior Publication Data
US 2015/0325559 A1 Nov. 12, 2015

(51) Int. Cl.
*H01L 25/16* (2006.01)
*H01L 21/768* (2006.01)
*H01L 23/31* (2006.01)
*H01L 23/495* (2006.01)
*H01L 23/522* (2006.01)
*H01L 23/00* (2006.01)
*H01L 25/00* (2006.01)
*H01L 23/528* (2006.01)

(52) U.S. Cl.
CPC ........ *H01L 25/165* (2013.01); *H01L 21/76877* (2013.01); *H01L 23/3107* (2013.01); *H01L 23/49503* (2013.01); *H01L 23/49562* (2013.01); *H01L 23/49568* (2013.01); *H01L 23/49575* (2013.01); *H01L 23/528* (2013.01); *H01L 23/5226* (2013.01); *H01L 24/17* (2013.01); *H01L 25/50* (2013.01); *H01L 2224/16113* (2013.01); *H01L 2224/16258* (2013.01); *H01L 2924/13091* (2013.01); *H01L 2924/14* (2013.01)

(58) Field of Classification Search
None
See application file for complete search history.

(56) References Cited

U.S. PATENT DOCUMENTS

| 7,679,173 | B2 * | 3/2010 | Uno | H01L 24/34 257/177 |
|---|---|---|---|---|
| 8,040,708 | B2 * | 10/2011 | Sato | H01L 23/4952 323/282 |
| 2013/0001792 | A1 * | 1/2013 | Uno | H01L 24/40 257/773 |
| 2013/0009299 | A1 * | 1/2013 | Takada | H01L 23/49524 257/676 |

* cited by examiner

*Primary Examiner* — Matthew Reames
*Assistant Examiner* — Steven B Gauthier
(74) *Attorney, Agent, or Firm* — Chein-Hwa S. Tsao; Chen-Chi Lin

(57) ABSTRACT

The present invention discloses a new embedded package comprising: a pre-mold lead frame with a plurality of chips attached thereon, where the molding material fills the voids of the lead frame, so that the lead frame is entirely solid; a plurality of pins arranged around the lead frame; a metal clip attached on and electrically connecting the chips together; first laminate layer which covers the chips, the lead frame, a metal clip and pins; conductive plug and extension formed to connect an electrode of a chip to a corresponding pin or to connect the chips together. The new embedded package of the invention with a three-dimensional stack capacity improves the thickness, thermal and electrical properties and the flexible power and logic hybrid design.

18 Claims, 8 Drawing Sheets

EMBEDDED PACKAGE AND METHOD THEREOF

FIELD OF PRESENT INVENTION

The present invention relates to a semiconductor package technology, and in particular, it refers to a new embedded package using a pre-mold lead frame, silicon or pre-molded chips and a copper clips and a method of manufacturing the package thereof.

BACKGROUND OF RELATED ART

FIG. 1 is a conventional embedded power metal-oxide-semiconductor field effect transistor (power MOSFET) (for example NXP Corp. MOSFET), wherein both sides of a power MOSFET 11 include electroplated metal coatings (an upper metal coating 12 and a lower metal coating 13) respectively. A drain electrode 121, a gate electrode 122 and a source electrode 123 are separately arranged in the upper metal coating 12, wherein the gate electrode 122 and the source electrode 123 at the upper metal coating 12 are electrical connected with a top gate and a top source of the power MOSFET respectively. However, the drain electrode 121 at the upper metal is electrically connected with the lower metal coating 13. The bottom drain of the power MOSFET is electrically connected to the drain electrode 121 at the upper metal coating 12 via the electrical connection between the upper metal coating 12 and the lower metal coating 13, so that the drain, the gate and the source electrodes of the power MOSFET device are arranged on the top side of the device. As such, the chip package is thinner. In the conventional embedded power MOSFET chip shown in FIG. 1, the MOSFET chip 11 is 150 µm thick and is attached, via a conductive bonding material such as tin solder, on the metal coating 13 of 36 µm thick, therefore the whole package thickness is 200 µm with a size of 3.2 mm×3.2 mm.

FIG. 2 is another conventional multi-chip power MOSFET package (for example AOS Corp. MOSFET package) including a lead frame 21, a clip 22 and semiconductor chips 23, 24, 25. Semiconductor chip 24 and semiconductor chip 25 are attached on the lead frame 21 and the metal clip 22 is then attached on top of chips 24 and 25. A semiconductor chip 23 is mounted on the clip 22. The clip 22 and the lead frame 21 are electrically connected together. The semiconductor chip 25 is a pre-molded chip with a thickness of 100 µm. The semiconductor chip 24 and the semiconductor chip 25 are connected to each other through the metal clip 22. The semiconductor chip 23 is an integrated circuit (IC) chip, which is connected with a pin of the lead frame 21 through a bonding wire. The whole package thickness is 1.1 mm and its size is 3.5 mm×5 mm.

Although the conventional package as shown in FIG. 1 has the advantages of achieving flexible package design and the extremely thin package process and easy implementation in a system in package (SIP), its thermal performance and electrical performance for high-power device are not good, for example the resistance of the device is 7-8 milliohm. The conventional package as shown in FIG. 2 has better electrical performance and thermal performance, thinner die package with the pre-molded chip compared with the one shown in FIG. 1, and compatibility with the traditional package process. However, this process is unable to achieve a thin package due to the loop height of the wire bond (WB) and the stacked structure and is difficult to implement in the SIP. In addition, this process cannot achieve the flexible package design due to the wire bonding limitation. The high difficulty, low package yield and inflexibility of this process are caused of wire bonding issue after solder flux cleaning process, mold flash issue caused by the complex structure of the lead frame and the deformation in the high-temperature package process. Finally, this process is high cost due to the expensive gold bonding wire for interconnection of the power chip and the logic IC chip.

BRIEF DESCRIPTIONS OF THE DRAWINGS

DESCRIPTIONS OF THE SPECIFIC EMBODIMENTS

The specific example embodiment of the present invention is to be described in detail hereunder with reference to the attached drawings.

Embodiment 1

Figure 1:
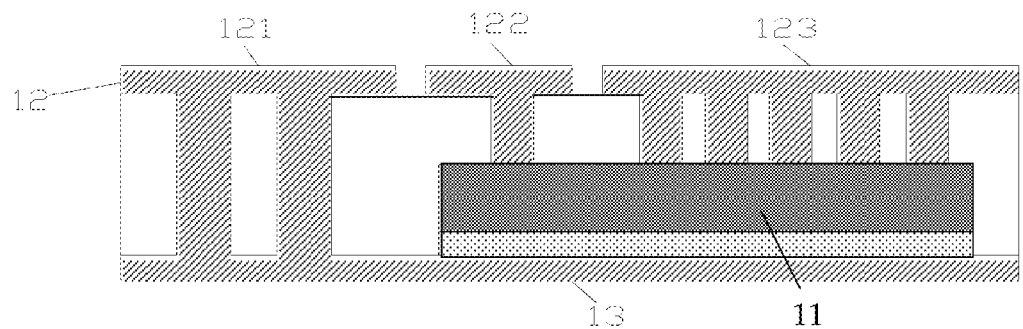
FIG. 1 is a schematic diagram of a package structure with an embedded power MOSFET in existing art.
Figure 2:
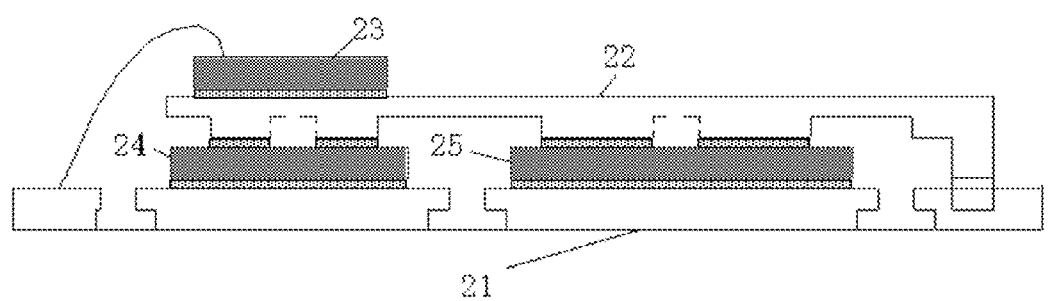
FIG. 2 is a schematic diagram of a multi-chip package structure with a pre-molded chip attached on a lead frame in the existing art.
Figure 3:
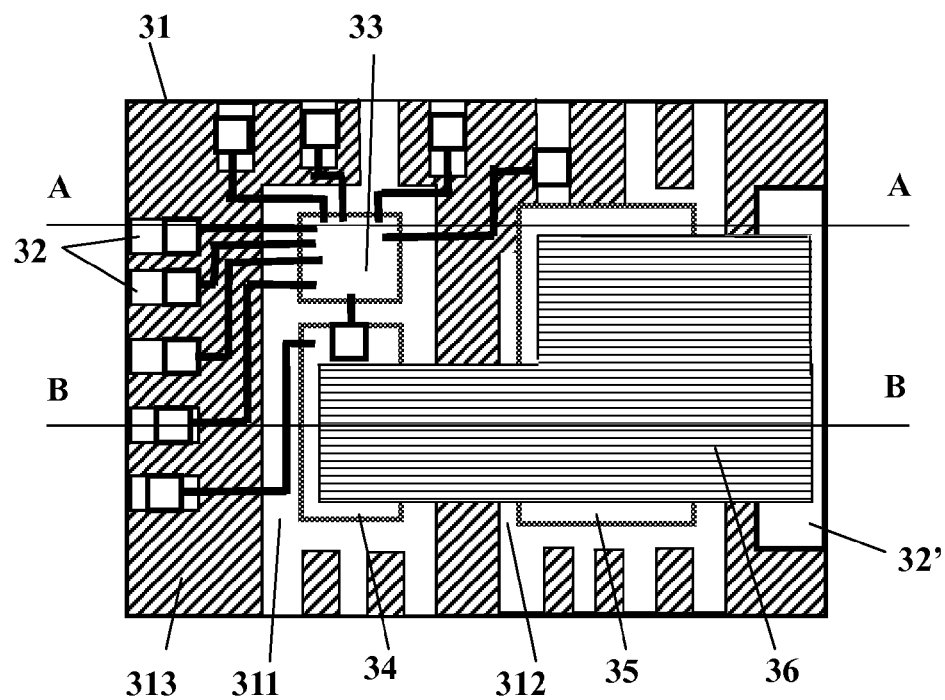
FIG. 3 is a top view of a new embedded package in an embodiment 1 of the present invention.

FIG. 3 shows a top view of a new embedded package of an embodiment 1 of the present invention. As shown in FIG. 3, the embedded package includes a pre-mold lead frame (pre-mold LDF) 31, which is made of a copper sheet and its surface can be subject to nickel plating, silver plating or gold plating. A first die pad 311 and a second die pad 312 of the same thickness are arranged on the same plane of the lead frame 31. A plurality of pins 32 and a pin 32' are arranged around the first die pad 311 and the second die pad 312, where some of the pins are separated and not electrically connected with the first die pad 311 and the second die pad 312, and the others are connected to the first die pad 311 or the second die pad 312 respectively. A molding material 313 is completely filled in the voids between the die pads and the pins of the lead frame so that the lead frame forms an entirely solid structure. Molding material 313 has a thickness substantially the same as the thickness of the first die pad 311 and the second die pad 312.

A first semiconductor chip 33 and a second semiconductor chip 34 are attached on the first die pad 311 separately, and a third semiconductor chip 35 is flipped and attached on the second die pad 312. In an embodiment, the first chip 33 is a logic IC chip, the second chip 34 and the third chip 35 are power MOSFET chips. As shown in figure, the first chip 33 and the second chip 34 are electrically connected to each other and are electrically connected to the corresponding pins 32 respectively.

A metal clip 36 is mounted atop and electrically connected to the second chip 34 and the third chip 35 respectively. The clip 36 only cover portions of the top surfaces of the second chip 34 and the third chip 35, which need to connect to a pin 32', for example, the clip 36 is electrically connected with the source at the top of the second chip 34 and the drain at the bottom of the flipped third chip 35. One end of the clip 36 is bonded on the pin 32' forming electrical connection between the second chip 34 and the third chip 35 and the pin 32'. Preferably, the clip 36 is made of copper, nickel or other conductive materials.

Figure 4:
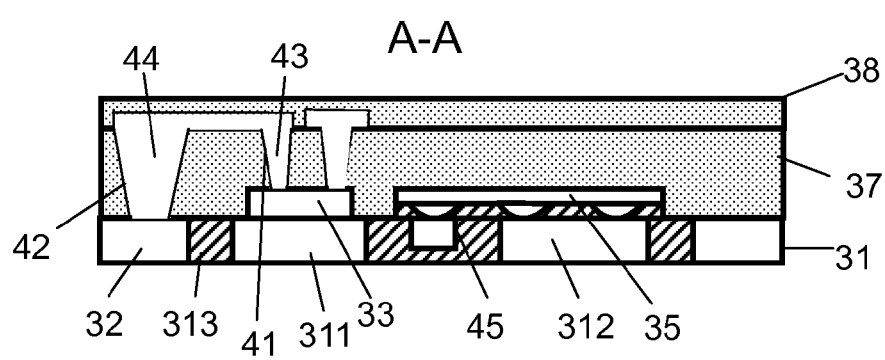
FIG. 4 is a cross-sectional view of the embedded package of FIG. 3 along a line A-A in the embodiment 1.
Figure 5:
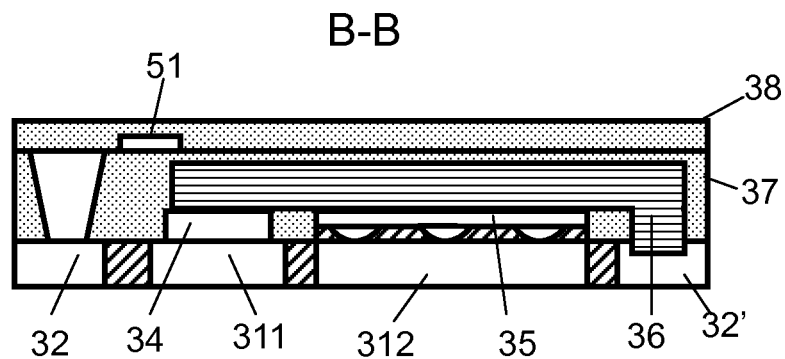
FIG. 5 is a cross-sectional view of the embedded package of FIG. 3 along a line B-B in the embodiment 1.

As shown in FIG. 4 and FIG. 5, the first chip 33, the second chip 34, the third chip 35, the lead frame 31, the clip 36 and the pins 32, 32' are covered with a first lamination layer 37. The first lamination layer 37, which can be a PP (Prepreg) layer, such as BT resin, fills in the gaps between the first chip 33, the second chip 34, the third chip 35, the lead frame 31, the clip 36 and the pins 32, 32'. As shown in FIG. 4 and FIG. 3, the first chip 33 is attached on the first die pad 311 of the lead frame 31 through a non-conductive bonding material, such as epoxy. A via 41 is formed, by etching or drilling, through the first lamination layer 37 above an electrode of the first chip 33 extending from the top surface of the first chip 33 to the top surface of the first lamination layer 37 and a via 42 is also formed through the first lamination layer 37 above a corresponding pin 32 extending from the top surface of the pin 32 to the top surface of the first lamination layer 37. Metal is deposited, for example by electroplating, in the vias 41 and 42 to form conductive plugs 43 and 44 respectively and also on the top surface of the first lamination layer 37 to form a conductive extension electrically connecting the conductive plug 43 to the conductive plug 44, as such an electrode of the first chip 33 is electrically connected with its corresponding pin 32.

As shown in FIG. 5 and FIG. 3, the drain at the bottom of the second chip 34 is electrically connected with the first die pad 311 of the lead frame 31 through a conductive bonding material. A via is formed through the first lamination 37 above the gate or source at the top of the second chip 34 (not shown), by etching and drilling, from the top surface of the second chip 34 to the top surface of the first lamination 37 and another via is also formed from the top surface of the pin 32 to the top surface of the first lamination layer 37 above another corresponding pin 32. Metal is deposited, for example by electroplating, into the vias forming the conductive plugs and also formed on the top surface of the first lamination layer 37 forming a conductive extension 51 electrically connecting the conductive plug connected with the gate or source of the second chip 34 and the conductive plug connected with the corresponding pin 32, so that the gate or source of the second chip 34 is electrically connected with its corresponding pin 32.

In addition, the first chip 33 is further electrically connected with the second chip 34 through the conductive plugs and conductive extensions in a similar way as described above. Preferably, the via is in a cone shape, where the end connected with the chip or the pin is smaller than the other end at the top surface of the first lamination layer 37.

As shown in FIG. 3, FIG. 4 and FIG. 5, the third chip 35, for example a power MOSFET, is flipped and attached on the second die pad 312 of the lead frame 31. The third chip 35 includes a solder ball array on the gate and the source at its top surface and thus the gate and the source of the third chip 35 are electrically connected with the lead frame 31 through the solder balls. As shown in FIG. 4, the lead frame 31 includes a gate pin 45 for connecting with the gate of the third chip 35. The solder ball at the gate of the third chip 35 is mounted on the gate pin 45 to ensure that the gate of the third chip will not shift on the second die pad 312.

A second lamination layer 38 is then formed on top of the first lamination layer 37 and covers all conductive plugs and conductive extensions, as well as the top surface of the first lamination layer 37 to complete package structure. The second lamination layer 38 is thinner than the first lamination layer 37 and is also made of the PP layer.

Figure 6:
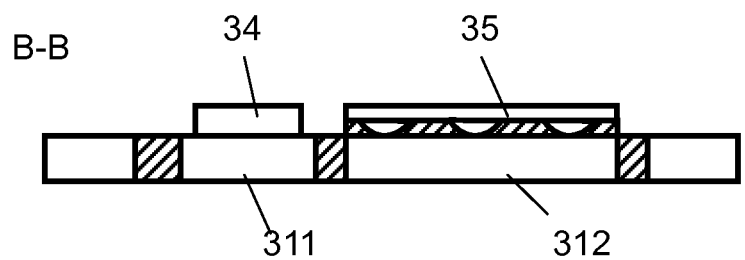
FIG. 6 is a cross-sectional view illustrating the step of attaching a second chip and a third chip on a lead frame in a method of forming the new embedded package of the present invention.
Figure 7:
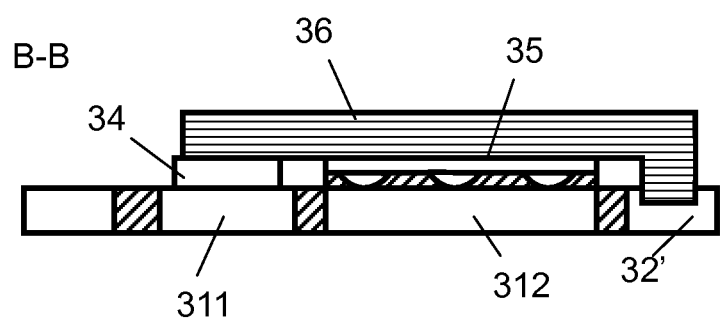
FIG. 7 is a cross-sectional view illustrating the step of connecting a clip atop the second and third chips in the method of forming the new embedded package of the present invention.

FIGS. 6-12 illustrate a method of manufacturing the new embedded package of FIG. 3. FIG. 6 and FIG. 7 are the cross-sectional diagrams along a line B-B in FIG. 3 in the package process, and FIGS. 8-12 are the cross-sectional diagrams along a line A-A in FIG. 3 in the package process. The manufacturing method comprises the following steps of:

Firstly, the pre-mold lead frame 31 is provided, which includes a first die pad 311 and a second die pad 312 separated from each other, a plurality of pins 32 and a pin 32' arranged around the first die pad 311 and the second die pad 312, where only some pins 32 are electrically connected with the first die pad 311 and the second die pad 312, and the other pins 32 and pin 32' are separated from the first die pad 311 and the second die pad 312; molding material is filled in the voids of the lead frame 31 so that the lead frame 31 is entirely solid.

As shown in FIG. 6, the drain at the bottom of the second chip 34 is electrically connected with the first die pad 311 of the lead frame 31 through a conductive bonding material; and the third chip 35 is flipped and mounted on the second die pad 312 of the lead frame 31 through the solder ball array. The second chip 34 and the third chip 35 are power MOSFET chips.

As shown in FIG. 7, the metal clip 36 is mounted on top of the second chip 34 and the third chip 35 and is electrically connected with the source at the top of the second chip 34 and the drain at the bottom of the flipped third chip 35 respectively. One end of the clip 36 is attached on the pin 32', so as the second chip 34 and the third chip 35 and the pin 32' are electrically connected to each others.

Figure 8:
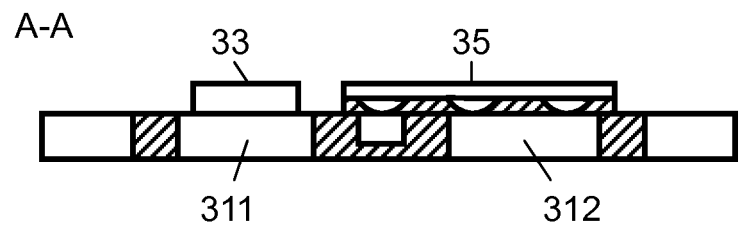
FIG. 8 is a cross-sectional view illustrating the step of attaching the first chip on the lead frame in the method of forming the new embedded package of the present invention.

As shown in FIG. 8, the first chip 33 is attached on the first die pad 311 of the lead frame 31 through a non-conductive bonding material, such as epoxy. The first chip 33 is the logic IC chip.

Figure 9:
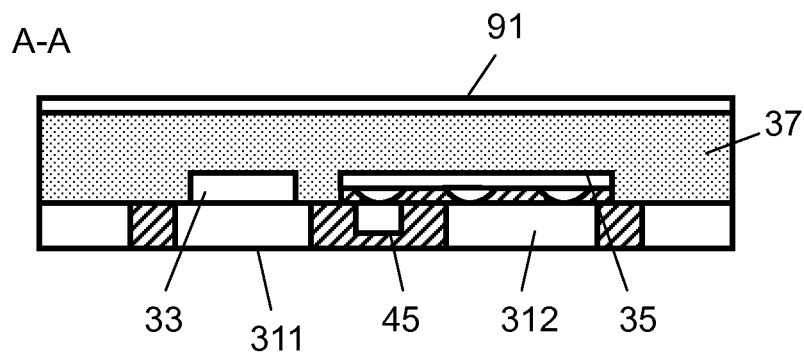
FIG. 9 is a cross-sectional view illustrating the step of forming a first lamination layer and a conductive layer in the method of forming the new embedded package of the present invention.

As shown in FIG. 9, the first lamination 37 layer is formed on top of and encapsulates the first chip 33, the second chip 34, the third chip 35, the lead frame 31 and the pins 32 and 32'. The first lamination layer 37 is the PP layer.

After forming the first lamination layer 37, a conductive layer 91, for example a metal layer, is formed atop the first lamination layer 37.

Alternatively, the first lamination layer 37 includes a PP layer and a thin metal layer atop the PP layer, for example a copper foil, used as the conductive layer.

Figure 10:
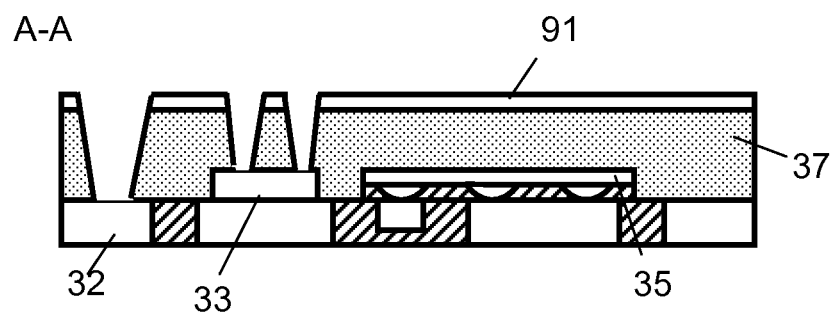
FIG. 10 is a cross-sectional view illustrating the step of forming a via through the first lamination layer in the method of forming the new embedded package of the present invention.

As shown in FIG. 10, vias are formed, by etching or drilling, through the first lamination layer 37 above gate or source at the top of the first chip 33 and the second chip 34 and their corresponding pins 32.

Figure 11:
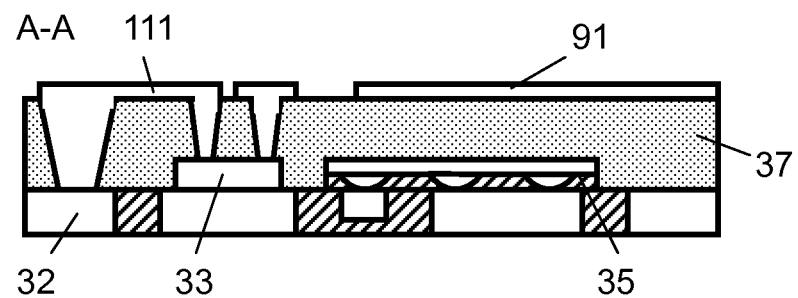
FIG. 11 is a cross-sectional view illustrating the step of forming a conductive plug and extension in the method of forming the new embedded package of the present invention.

As shown in FIG. 11, conductive material is deposited to fill in the vias forming the conductive plugs extending from the top surface of the chip or the pin to the top surface of the first lamination 37. Preferably, the conductive material is copper.

After forming the conductive plugs, the conductive layer 91 is etched to form an electrically connected line 111 for electrically connecting the conductive plugs above the gate or source at the top of the first chip 33, the second chip 34 and the corresponding pins respectively.

Figure 12:
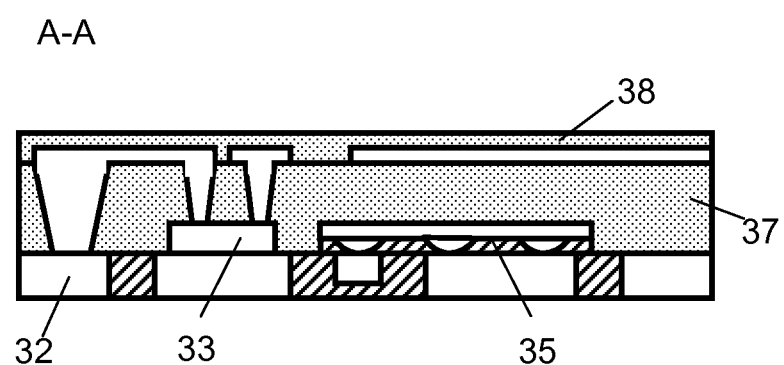
FIG. 12 is a cross-sectional view illustrating the step of forming a second lamination layer in the method of forming the new embedded package of the present invention.

As shown in FIG. 12, after forming the electrical connection between the conductive plugs, the second lamination layer 38 is formed atop the first lamination layer 37 covering the conductive plugs and its electrically connected line to complete the package. The second lamination layer 38 is thinner than the first lamination layer 37. The second lamination layer 38 is also a PP layer.

Embodiment 2

Figure 13:
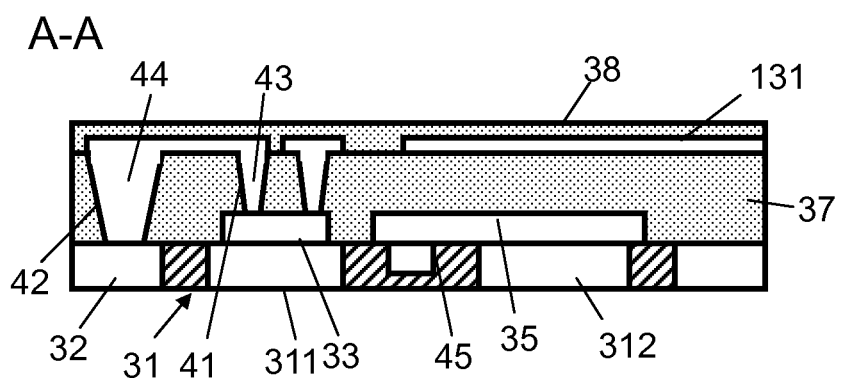
FIG. 13 is a cross-sectional view along a line A-A of FIG. 3 in the embodiment 2 of the present invention.
Figure 14:
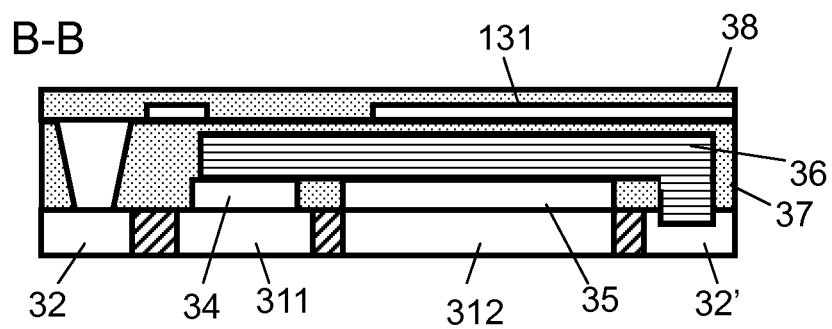
FIG. 14 is a cross-sectional view along a line B-B of FIG. 3 in the embodiment 2 of the present invention.

With reference to the top view of FIG. 3, the cross-sectional view of FIG. 13 (along a line A-A of FIG. 3) and the cross-sectional view of FIG. 14 (along a line B-B of FIG. 3), the embodiment 2 discloses another new embedded package. The embedded package includes a pre-mold lead frame (pre-mold LDF) 31, where the lead frame 31 is made of a copper sheet and its surface can be subject to nickel plating, silver plating or gold plating. The lead frame 31 includes a first die pad 311 and a second die pad 312 of the same thickness arranged on the same plane of the lead frame 31 and plurality of pins 32 and a pin 32' arranged around the first die pad 311 and the second die pad 312, where some pins are separated from the first die pad 311 and the second die pad 312, and others pins are connected with the first die pad 311 or the second die pad 312 respectively. The molding material is filled in the voids of the lead frame so that the lead frame is entirely solid.

A first chip 33 and a second chip 34 are separately attached on the first die pad 311, and a third chip 35 is flipped and attached on the second die pad 312. The first chip 33 is a logic IC chip, the second chip 34 and the third chip 35 are power MOSFET chips. As shown in figure, the first chip 33 and the second chip 34 are electrically connected together; in addition, the first chip 33 and the second chip 34 are further electrically connected with their corresponding pins 32 respectively.

A clip 36 is mounted on the top surface of the second chip 34 and the third chip 35 and is electrically connected to the second chip 34 and the third chip 35 respectively. The clip 36 only covers the parts of the surfaces of the second chip 34 and the third chip 35 that need to be connected with the pins, for example, the clip 36 is electrically connected with the source at the top of the second chip 34 and the drain at the bottom of the flipped third chip 35. One end of the clip 36 is mounted on a pin 32' forming an electrical connection between the second chip 34 and the third chip 35 and the pin 32'. Preferably, the clip 36 is made of the copper sheet, nickel sheet or other clips of electrical conductivity.

As shown in FIG. 13 and FIG. 14, the first chip 33, the second chip 34, the third chip 35, the lead frame 31, the clip 36 and the pins 32 are covered with a first lamination layer 37. The first lamination layer 37 is a PP layer that also fills in the gaps between the first chip 33, the second chip 34, the third chip 35, the lead frame 31, the clip 36 and the pins 32.

As shown in FIG. 13 and FIG. 3, the first chip 33 is arranged on the first die pad 311 of the lead frame 31 through an epoxy layer. A via 41 is formed, for example by etching or drilling, through the first lamination layer 37 above an electrode at the top surface of the first chip 33 from the top surface of the first chip 33 to the top surface of the first lamination 37 and another via 42 is also formed through the first lamination layer 37 above a corresponding pin 32 from the top surface of the pin 32 to the top surface of the first lamination 37. Metal is deposited, for example by electroplating, in the vias 41 and 42 to form conductive plugs 43 and 44 respectively. The electroplated metal can be copper. Metal also is deposited on the top surface of the first lamination layer 37 forming a conductive extension that connects the conductive plug 43 connected with an electrode of the first chip 33 and the conductive plug 44 connected to the corresponding pin 32, so that the electrode of the first chip 33 is electrically connected with its corresponding pin 32.

As shown in FIG. 14 and FIG. 3, the drain at the bottom of the second chip 34 is electrically connected with the first die pad 311 of the lead frame 31 through a conductive bonding material. A via is formed above the gate or source at the top of the second chip 34 through the first lamination layer 37 extending from the top surface of the second chip 34 to the top surface of the first lamination layer 37, and another via is also formed above a corresponding pin 32 through the first lamination layer extending from the top surface of the pin 32 to the top surface of the first lamination layer 37. Metal is deposited into each via forming the conductive plug and on the top surface of the first lamination layer 37 forming the conductive extension connecting the conductive plug above the gate or source of the second chip 34 to the conductive plug above the corresponding pin, so that the gate or source of the second chip 34 is electrically connected with its corresponding pin 32. In addition, the first chip 33 is further electrically connected with the second chip 34 through the conductive plugs and conductive extension.

Preferably, the via formed in the first lamination layer 37 is in a cone shape with the end connected to the chip or the pin is smaller than the other end.

As shown in FIG. 13 and FIG. 14, the third chip 35 is flipped and mounted on the second die pad 312 of the lead frame 31 via a conductive bonding material. The third chip 35 is the power MOSFET chip.

A gate pin 45 arranged in the lead frame 31 is electrically connected to the gate of the third chip 35 correspondingly via a conductive bonding material, e.g., the tin solder, to ensure that the gate of the third chip 35 will not shift on the top surface of the second die pad 312.

As shown in FIG. 13 and FIG. 14, a heat dissipation layer 131 is further arranged on the top surface of the first lamination layer 37 for dissipating the heat from the clip 36 and/or the chip to improve the heat performance of the package. The heat dissipation layer 131 is made of a thin layer of a metal with good heat conduction, for example copper or aluminum.

A second lamination layer 38 is then formed over the structure covering all conductive plugs and conductive extensions, the top surface of the first lamination layer 37 and the heat dissipation layer 131 completing the package structure. The second lamination layer 38 is thinner than the first lamination layer 37 and is made of the PP layer.

The method of manufacturing the package structure of the embodiment 2 is essentially the same as the method of manufacturing the package structure of embodiment 1 as described above.

Embodiment 3

Figure 15:
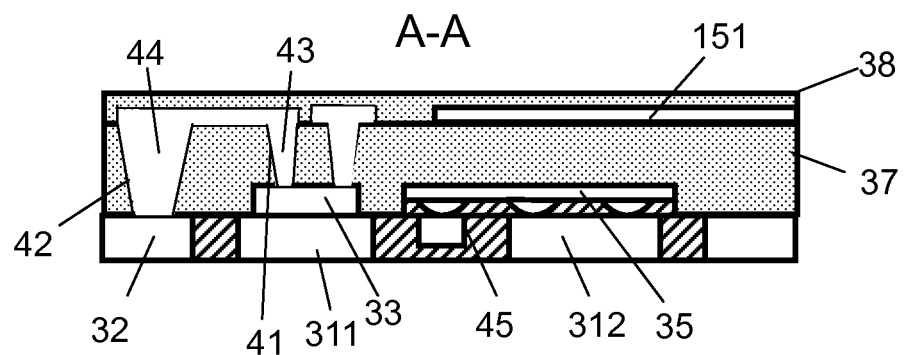
FIG. 15 is a cross-sectional view along a line A-A of FIG. 3 in the embodiment 3 of the present invention.
Figure 16:
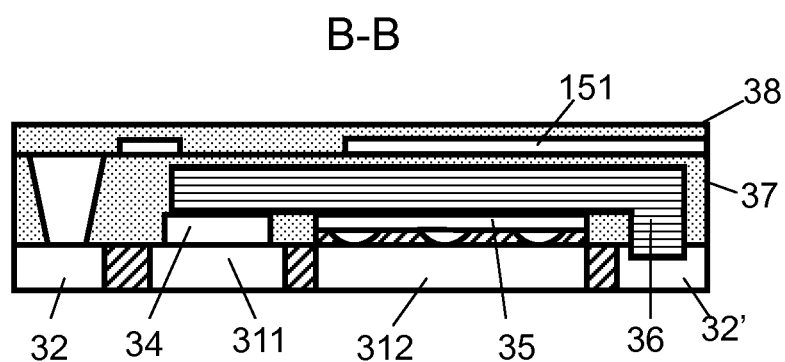
FIG. 16 is a cross-sectional view along a line B-B of FIG. 3 in the embodiment 3 of the present invention.

With reference to the top view shown in FIG. 3, the cross-sectional view shown in FIG. 15 (along line A-A of FIG. 3) and the cross-sectional view shown in FIG. 16 (along line B-B of FIG. 3), the embodiment 3 discloses another new embedded package. As shown in the figures, the package includes a pre-mold lead frame (pre-mold LDF) 31, which is made of a copper sheet and its surface can be subject to nickel plating, silver plating or gold plating and including a first die pad 311 and a second die pad 312 of the same thickness arranged on the same plane of the lead frame 31. A plurality of pins 32 and a pin 32' are arranged around the first die pad 311 and the second die pad 312, where some pins are separated from the first die pad 311 and the second die pad 312 and the other pins are connected with the first die pad 311 or the second die pad 312 respectively. The molding material is filled in the voids of the lead frame so that the lead frame is an entirely solid structure.

A first chip 33 and a second chip 34 are attached on the first die pad 311 separately, and a third chip 35 is flipped and attached on the second die pad 312. The first chip 33 is a logic IC chip, the second chip 34 and third chip 35 are power MOSFET chips. As shown in figure, the first chip 33 and the second chip 34 are electrically connected together; in addition, the first chip 33 and the second chip 34 are further electrically connected to their corresponding pins 32 respectively.

Clip 36 is mounted on and electrically connected to the second chip 34 and the third chip 35 respectively. The clip 36 only covers the parts of the second chip 34 and the third chip 35 needing to be connected with the pins, for example, the clip 36 is electrically connected with the source at the top of the second chip 34 and the drain at the bottom of the flipped third chip 35. The other end of the clip 36 is mounted on a pin 32' for an electrical connection between the second chip 34 and the third chip 35 and the pin 32'. Preferably, the clip 36 is made of a copper sheet, nickel sheet or other conductive materials.

As shown in FIG. 15 and FIG. 16, the first chip 33, the second chip 34, the third chip 35, the lead frame 31, the clip 36 and the pins 32, 32' are covered with a first lamination layer 37. The first lamination layer 37 is a PP layer that also fills the gaps between the first chip 33, the second chip 34, the third chip 35, the lead frame 31, the clip 36 and the pins 32, 32'. As shown in FIG. 15 and FIG. 3, the first chip 33 is attached on the first die pad 311 of the lead frame 31 through a non-conductive bonding material, such as an epoxy. A via 41 is formed, for example by etching or drilling, through the first lamination layer 37 above an electrode at the top surface of the first chip 33 extending from the top surface of the first chip 33 to the top surface of the first lamination layer 37, and another via 42 is also formed through the first lamination layer 37 above a corresponding pin 32 extending from the top surface of the pin 32 to the top surface of the first lamination layer 37. Metal is deposited, for example by electroplating, in the vias 41 and 42 to form conductive plugs 43 and 44 respectively and on the top surface of the first lamination layer 37 to form a conductive extension connecting the conductive plugs 43 and 44 together. The metal can be copper. The conductive plug 43 is electrically connected with some electrode of the first chip 33 and the conductive plug 44 is electrically connected to the corresponding pin, so that the specific electrode of the first chip 33 is electrically connected with its corresponding pin 32.

As shown in FIG. 16 and FIG. 3, the drain at the bottom of the second chip 34 is electrically connected with the first die pad 311 of the lead frame 31 through a conductive bonding material. A via is formed, by etching or drilling, through the first lamination layer 37 above a gate or source at the top of the second chip from the top surface of the second chip 34 to the top surface of the first lamination layer 37 and another via is also formed through the first lamination layer 37 above a corresponding pin 32 extending from the top surface of the pin to the top surface of the first lamination layer 37. Metal is deposited in each via, for example by electroplating, to form the conductive plug and also on the top surface of the first lamination layer 37 forming the conductive extension connecting the conductive plug connected with the gate or source of the second chip 34 and the conductive plug connected to the corresponding pin so that the electrode of the second chip 34 is electrically connected with its corresponding pin 32.

In addition, the first chip 33 is further electrically connected with the second chip 34 through the conductive plug and conductive extension.

Preferably, the via is in a cone shape with one end connected with the chip or the pin is smaller than the end at the top surface of the first lamination layer 37.

As shown in FIG. 15 and FIG. 16, the third chip 35 is flipped and attached on the second die pad 312 of the lead frame 31 and it is a power MOSFET chip with a solder ball array formed on the gate and source at its top surface. As such, the gate and source of the third chip 35 are electrically connected with the lead frame 31 through the solder balls. A gate pin 45 is formed in the lead frame 31 in a location corresponding with the gate of the third chip 35. The solder ball at the gate of the third chip 35 is attached on the gate pin 45 to ensure the gate of the third chip 35 from shifting to the second die pad 312.

As shown in FIG. 15 and FIG. 16, a heat dissipation layer 151 is formed on the top surface of the first lamination layer 37 for dissipating the heat from the clip 36 and/or the chip to improve the heat performance of package. The heat dissipation layer 151 is made of a metal with good heat conducting performance, for example copper or aluminum.

A second lamination layer 38 is then formed on the first lamination layer 37 covering all conductive plugs and extensions, the top surface of the first lamination layer 37 and the heat dissipation layer 151 to complete the package structure. The second lamination layer 38 is thinner than the first lamination layer 37.

The method of manufacturing the package of the embodiment 3 is essentially the same as the method of manufacturing the package of the embodiments 1 as described above.

Embodiment 4

Figure 17:
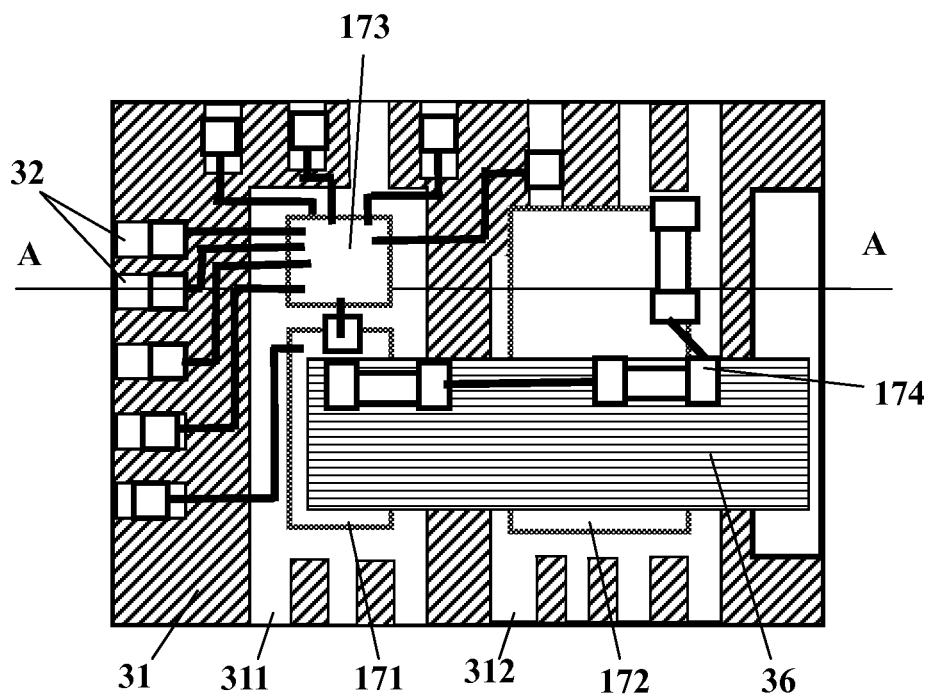
FIG. 17 is a top view of a new embedded package in an embodiment 4 of the present invention.
Figure 18:
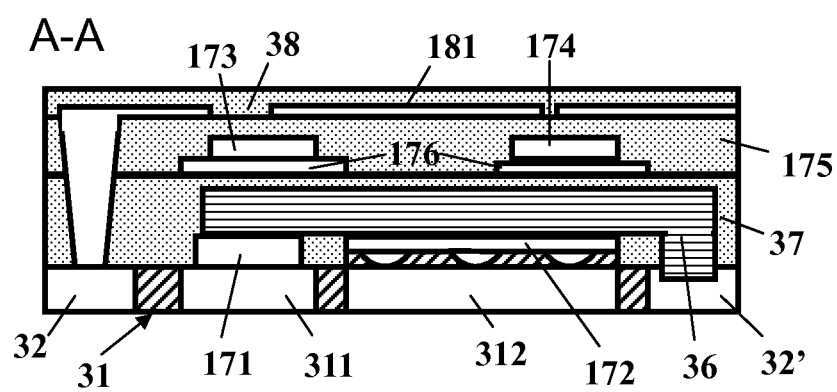
FIG. 18 is a cross-sectional view along a line A-A of FIG. 17.

As shown in the top view of FIG. 17 and the cross-sectional view of FIG. 18 (along a line A-A in FIG. 17), the embodiment 4 discloses a SIP of 3D stack power and logic chips. The package includes a pre-mold lead frame (pre-mold LDF) 31, where the lead frame 31 is made of a copper sheet and its surface can be subjected to nickel plating, silver plating or gold plating. The lead frame 31 includes a first die pad 311 and a second die pad 312 of the same thickness arranged on the same plane of the lead frame 31 and a plurality of pins 32 arranged around the first die pad 311 and the second die pad 312, where some pins are separated from the first die pad 311 and the second die pad 312, and the other pins are connected with the first die pad 311 or the second die pad 312 respectively. The mold material is filled in the voids of the lead frame so that the lead frame is entirely solid.

A first power chip 171 is attached on the first die pad 311, and a second power chip 172 is flipped and attached on the second die pad 312. The first power chip 171 and the second power chip 172 can be MOSFETs.

A clip 36 is attached on and electrically connected to the first power chip 171 and the second power chip 172 respectively. The clip 36 only covers parts of the top surface of the first power chip 171 and the bottom surface of the flipped second power chip 172 that need to be connected to corresponding pins 32, for example, the clip 36 is electrically connected to the source electrode at the top surface of the first power chip 171 and the drain electrode at the bottom surface of the flipped second power chip 172. The other end of the clip 36 is connected with a pin 32' forming an electrical connection between the top surface of the first power chip 171 and the bottom surface of the flipped second power chip 172 and the pin 32'. Preferably, the clip 36 is made of a copper sheet, nickel sheet or other conductive clips.

As shown in FIG. 18, the first power chip 171, the second power chip 172, the lead frame 31, the clip 36 and the pins 32, 32' are covered with a first lamination layer 37. The first lamination layer 37 can be a PP layer that also fills in the gaps between the first power chip 171, the second power chip 172, the lead frame 31, the clip 36 and the pins 32, 32'.

As shown in FIGS. 17 and 18, a passive device 174 and a logic IC chip 173 are attached on the first lamination layer 37. An intermediate lamination layer 175 is formed to cover the passive device 174, the first lamination layer 37 and the logic IC chip 173. The intermediate lamination layer 175 is thinner than the first lamination layer 37. The intermediate lamination layer 175 may be a PP layer. A thin copper pad 176 is formed between the first lamination layer 37 and the passive device 174 and between the first lamination layer 37 and the logic chip 173 respectively. The logic chip 173 and the passive device 174 are mounted on the copper pad 176 through soldering tin and are interconnected with the other functional devices via the copper routing.

A via is formed above the logic chip 173, by etching and drilling, through the intermediate lamination layer 175 extending from the top surface of the logic chip 173 to the top surface of the intermediate lamination layer 175 and another via is also formed through the first lamination layer 37 and intermediate lamination layer 175 above the corresponding pins 32 extending from the top surface of the pin 32 to the top surface of the intermediate lamination layer 175. Conductive material is deposited, for example by electroplating, to form the conductive plug in each via and conductive extension connecting the conductive plug connected to the logic IC chip 173 and the conductive plug connected to pin 32, so that the logic IC chip 173 is electrically connected with its corresponding pin 32.
In addition, the logic IC chip 173 is further electrically connected with the clip 36 through the conductive plug and conductive extension.
Preferably, the vias formed in the first lamination layer 37 and the intermediate lamination layer 175 are cone shape, where one end connected with the chip or the pin is smaller than the other end.

As shown in FIG. 18, the second power chip 172 is flipped and attached on the second die pad 312 of the lead frame 31 and it is a power MOSFET chip. A solder ball array is formed on the electrodes at it top surface. The gate and source electrode of the flipped second power chip 172 are thus electrically connected with the lead frame 31 through these solder balls. Preferably, a heat dissipation layer 181 is further formed on the top surface of the intermediate lamination layer 175 for heat dissipation to improve the heat performance of package. The heat dissipation layer 181 is made of metal with good heat conducting performance, which can be copper or aluminum.

A second lamination layer 38 is then formed on the intermediate lamination layer 175 covering all conductive plugs and conductive extensions, the top surface of the intermediate lamination layer 175 and the heat dissipation layer 181 to complete the overall package structure. The second lamination layer 38 is thinner than the first lamination layer 37 and is also made of the PP layer.

The method of manufacturing the embedded package of the embodiment 4 is as follows: Firstly, a pre-mold the lead frame 31 is provided, which comprises a first die pad 311 and a second die pad 312, the pins 32 arranged around the first die pad 311 and the second die pad 312, where some of the pins 32 are electrically connected with the first die pad 311 and the second die pad 312, and the other pins are separated from the first die pad 311 and the second die pad 312; a mold material is filled in the voids of the lead frame 31 so that the lead frame 31 is entirely solid.

The bottom drain of the first power chip 171 is electrically connected with the first die pad 311 of the lead frame 31 through a conductive bonding material; and the second power chip 172 is flipped and attached on the second die pad 312 of the lead frame 31 through the solder ball array formed on the electrodes at the top surface of the chip.

The clips 36 are then attached on the first power chip 171 and the second power chip 172 and are electrically connected with the source of the first power chip 171 and the drain of the second power chip 172 respectively. One end of the clip 36 is further attached with the corresponding pin 32', so as to achieve the electrical connection between the first power chip 171, the second power chip 172 and the pin 32'.

The first lamination layer 37 is formed atop the structure to encapsulate the first power chip 171, the second power chip 172, the lead frame 31 and the pins 32, 32'. The first lamination layer 37 is a PP layer.
After forming the first lamination layer 37, a conductive layer is formed on the first lamination layer 37.
Alternatively, the first lamination layer 37 can include a PP layer with a thin copper foil used as the conductive layer formed atop the PP layer.

Vias are then formed, by etching or drilling, through the first lamination layer 37 above the electrodes of the first power chip 171 and the second power chip 172 and the respective corresponding pins 32.
The metal is deposited, by electroplating, in each via to form the conductive plug extending from the surface of the chip or the pin to the surface of the first lamination layer 37. Preferably, the metal for forming the conductive plug is copper.

After forming the conductive plugs, the conductive layer or the copper foil of the first lamination layer 37 is etched to form the electrically connected lines 111 of FIG. 11, which electrically connect the conductive plug connected to the first power chip 171, the conductive plug connected to the second power chip 172 and the conductive plugs connected to the corresponding pins 32 respectively, and the copper foil pad 176. The logic IC chip 173 and the passive device 174 are attached on separate copper foil pad 176 via a conductive bonding material, such as soldering tin.

Then, the intermediate lamination layer 175 is formed on the first lamination layer 37 covering the conductive plugs and its electrically connected line, the logic chip 173 and the passive device 174. The intermediate lamination layer 175 is thinner than the first lamination layer 37. The intermediate lamination layer 175 can also include a PP layer and a copper foil. At this stage, vias are then again formed through the intermediate lamination layer 175 and/or the first lamination layer 37 above the electrodes of the logic chip 173, the passive device 174, the first power chip 171 and the second power chip 172, which need to be connected with the pin or connecting with each other, and above the respective corresponding pin 32.

After forming the conductive plugs in the vias, the conducting layer or the copper foil of the intermediate lamination layer 175 is etched to form an electrically connected line (not shown) similar as the connected line 111 of FIG. 11 that electrically connects the conductive plug connected to the logic chip 173, the conductive plug connected to the passive device 174 and the conductive plug connected to the corresponding pin, and also forming the heat dissipation layer 181.

Finally, the second lamination layer 38 is formed on the intermediate lamination layer 175 to cover the conductive structure and its electrically connected line to complete the whole package structure.

It is thus clear that from the package structures of different embodiments, the corresponding laminate layer can be added or omitted depending on specific requirements. 3D stack package can be achieved through lamination. Under the requirement of the package size, the package structures may include different package layers. In addition, with the feature of arranging the conductive plug in the present invention, the semiconductor devices in different layers of the stack structure are in electrical connection, thus achieve the SIP without affecting the structure requirement.

Although the contents of the present invention have been introduced in detail through the preferred embodiments above, it should be recognized that the descriptions above should not limit the scope of the invention. Obviously there will be various changes and corrections by the technical personnel in this field who read the specification above. Therefore, the protection scope of the invention shall be limited by the attached claims.

The invention claimed is:

1. An embedded package comprising:
a pre-mold lead frame;
a first chip, a second chip, and a third chip attached on the pre-mold lead frame;
a first pin, a second pin and a clip-connection pin arranged around the pre-mold lead frame;
mold material filled in a void of the pre-mold lead frame so that the pre-mold lead frame is entirety solid;
a clip attached to a portion of the second chip and to a portion of the third chip, wherein the second chip is electrically connected to the third chip through the clip and wherein one end of the clip is electrically connected with the clip-connection pin;
a first lamination layer covering the first, second and third chips, the pre-mold lead frame, the clip, the first and second pins, and the clip-connection pin;
a first via formed at an area above an electrode of the first chip and a second via formed at another area above the first pin, through the first lamination layer from a top surface of the first chip or a top surface of the first pin to a top surface of the first lamination layer, wherein the first via is filled with a conductive material to form a first conductive plug and wherein the second via is filled with the conductive material to form a second conductive plug; and
a conductive extension connecting the first conductive plug to the second conductive plug;
wherein the first chip is electrically connected to the first pin through the first conductive plug, the conductive extension, and the second conductive plug;
wherein the second chip is electrically connected to the second pin; and
wherein the first chip is electrically connected to the second chip.

2. The embedded package of claim 1, wherein the first chip is a logic IC chip.

3. The embedded package of claim 2, wherein the first chip is attached to the pre-mold lead frame through a non-conductive bonding material.

4. The embedded package of claim 1, wherein the second chip is a metal-oxide-semiconductor field effect transistor (MOSFET) chip.

5. The embedded package of claim 4, wherein a drain at a bottom of the second chip is electrically connected to the pre-mold lead frame.

6. The embedded package of claim 1, wherein the third chip is a metal-oxide-semiconductor field effect transistor (MOSFET) power chip that is flipped and attached to the pre-mold lead frame.

7. The embedded package of claim 6, wherein solder balls are formed at a gate and a source on a top surface of the third chip for electrically connecting the third chip to the pre-mold lead frame.

8. The embedded package of claim 7, wherein the pre-mold lead frame comprises a gate pin being electrically connected to the gate of the third chip and wherein a portion of the solder balls at the gate of the third chip is electrically connected to the gate pin.

9. The embedded package of claim 8, wherein the pre-mold lead frame further comprises a first die pad and a second die pad separated from the first die pad; wherein the first chip and the second chip are attached to the first die pad; and wherein the third chip is attached to the second die pad.

10. The embedded package of claim 8, wherein the clip is attached on and electrically connected to a source of the second chip and a drain of the flipped third chip.

11. The embedded package of claim 1, wherein the first lamination layer is a Prepreg layer.

12. The embedded package of claim 1, wherein a second lamination layer is formed covering the first lamination layer, the first and second conductive plugs and the conductive extension.

13. The embedded package of claim 12, wherein the second lamination layer is a Prepreg layer.

14. The embedded package of claim 1, wherein the first via is of a cone shape and wherein the cone shape has a larger diameter at a top end of the cone shape.

15. The embedded package of claim 1, wherein a heat dissipation layer is formed on the top surface of the first lamination layer.

16. The embedded package of claim 15, wherein the heat dissipation layer is made of a heat conductive metal.

17. The embedded package of claim 1, wherein a second lamination layer is formed covering the first lamination layer, the first and second conductive plugs and the conductive extension and wherein an intermediate lamination layer is formed between the first lamination layer and the second lamination layer.

18. The embedded package of claim 17, wherein electronic devices are attached atop the first lamination layer and wherein the electronic devices are covered by the intermediate lamination layer.

* * * * *